(12) United States Patent
Reeder

(10) Patent No.: US 7,375,522 B2
(45) Date of Patent: May 20, 2008

(54) METHOD FOR ALIGNING MULTIPLE MR IMAGES ACQUIRED WITH ALTERNATING READOUT GRADIENT

(75) Inventor: Scott B. Reeder, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 36 days.

(21) Appl. No.: 11/510,896

(22) Filed: Aug. 28, 2006

(65) Prior Publication Data

US 2008/0048657 A1     Feb. 28, 2008

(51) Int. Cl.
*G01V 3/00* (2006.01)

(52) U.S. Cl. .................. 324/307; 324/309

(58) Field of Classification Search ........ 324/300–322; 600/407–455; 382/128, 130, 2; 337/10; 128/922; 356/39
See application file for complete search history.

(56) References Cited

U.S. PATENT DOCUMENTS

| | | | |
|---|---|---|---|
| 5,144,235 A | | 9/1992 | Glover et al. |
| 5,225,781 A | | 7/1993 | Glover et al. |
| 5,321,359 A | | 6/1994 | Schneider |
| 5,677,628 A | * | 10/1997 | Watanabe et al. ........... 324/309 |
| 6,016,057 A | | 1/2000 | Ma |
| 6,483,308 B1 | * | 11/2002 | Ma et al. ................ 324/312 |
| 6,603,990 B2 | | 8/2003 | Zhang et al. |
| 6,995,560 B2 | | 2/2006 | Duerk et al. |
| 7,042,215 B2 | * | 5/2006 | Moriguchi et al. ......... 324/307 |
| 7,084,626 B2 | * | 8/2006 | Ma et al. ................ 324/307 |
| 7,099,499 B2 | * | 8/2006 | Blezek et al. ............. 382/128 |

OTHER PUBLICATIONS

Scott B. Reeder et al, Multicoil Dixon Chemical Species Separation With an Iterative Least-Squares Estimation Method, MRM 51:35-45 (2004).
J. Ma et al, A Fast Spin Echo Triple Echo Dixon (ITED) Technique For Efficient T2-Weighted Water and Fat Imaging, Proc. Intl. Soc. Mag. Reson. Med. 14 (2006).
Jingfei Ma et al, Fat-Suppressed Three-Dimensional Dual Echo Dixon Technique For Contrast Agent Enhanced MRI, JMRI vol. 23, No. 1, p. 36-41, Jan. 2006.

* cited by examiner

*Primary Examiner*—Brij B. Shrivastav
(74) *Attorney, Agent, or Firm*—Quarles & Brady LLP

(57) ABSTRACT

A water and fat image are acquired using a pulse sequence in which NMR signals for one image data set are acquired with a readout gradient of one polarity and NMR signals for the other image data set are acquired with a readout gradient of the opposite polarity. A misalignment of fat signals caused by chemical shift is corrected by calculating separate water and fat image data sets in k-space and then transforming them to real space images.

5 Claims, 5 Drawing Sheets

US 7,375,522 B2

METHOD FOR ALIGNING MULTIPLE MR IMAGES ACQUIRED WITH ALTERNATING READOUT GRADIENT

BACKGROUND OF THE INVENTION

The field of the invention is nuclear magnetic resonance imaging ("MRI") methods and systems. More particularly, the invention relates to the reconstruction of images of multiple, chemical shifted spin species.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, Mz, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The present invention will be described in detail with reference to a variant of the well known Fourier transform (FT) imaging technique, which is frequently referred to as "spin-warp". The spin-warp technique is discussed in an article entitled "Spin-Warp NMR Imaging and Applications to Human Whole-Body Imaging" by W. A. Edelstein et al., Physics in Medicine and Biology, Vol. 25, pp. 751-756 (1980). It employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase encoding gradient ($G_y$) along that direction, and then an NMR signal is acquired in the presence of a readout magnetic field gradient ($G_x$) in a direction orthogonal to the phase encoding direction. The readout gradient present during the acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan to produce a set of NMR data from which an entire image can be reconstructed.

In an NMR imaging sequence, a uniform magnetic field $B_0$ is applied to an imaged object along the z axis of a Cartesian coordinate system. The effect of the magnetic field $B_0$ is to align the object's nuclear spins along the z axis. In this field, the nuclei resonate at their Larmor frequencies according to the following equation:

$$\omega = \gamma B_0$$

where $\omega$ is the Larmor frequency, and $\gamma$ is the gyromagnetic ratio which is a property of the particular nucleus. The nuclei respond to RF pulses at this frequency by tipping their longitudinal magnetization into the transverse, x-y plane. Water, because of its relative abundance in biological tissue and the properties of its proton nuclei, is of principle concern in such imaging. The value of the gyromagnetic ratio $\gamma$ for protons in water is 4.26 kHz/Gauss and therefore in a 1.5 Tesla polarizing magnetic field $B_0$, the resonant or Larmor frequency of water protons is approximately 63.9 MHz.

Materials other than water, principally fat, are also to be found in biological tissue and have different gyromagnetic ratios. The Larmor frequency of protons in fat is approximately 210 Hz lower than that of protons in water in a 1.5 Tesla polarizing magnetic field $B_0$. The difference between the Larmor frequencies of such different isotopes or species of the same nucleus, viz., protons, is termed chemical shift, reflecting the differing chemical environments of the two species.

In the well known slice selective RF pulse sequence, a slice select magnetic field gradient $G_z$ is applied at the time of the RF pulse so that only the nuclei in a slice through the object in an x-y plane are excited. After the excitation of the nuclei, magnetic field gradients are applied along the x and y axes and an NMR signal is acquired. The readout gradient $G_x$ along the x axis causes the nuclei to precess at different resonant frequencies depending on their position along the x axis; that is, $G_x$ spatially encodes the precessing nuclei by frequency. But because water and fat spins resonate at different frequencies, even when they are in the same location, their locations in the reconstructed image will be shifted with respect to each other. This is particularly problematic on the boundaries of tissues or organs where this chemical shift can cause blurring or multiple edges.

There is a large body of art that has been developed to suppress the signals from either water or fat. Reliable and uniform fat suppression is essential for accurate diagnoses in many areas of MRI. This is particularly true for sequences such as fast spin-echo (FSE), steady-state free precession (SSFP) and gradient echo (GRE) imaging, in which fat is bright and may obscure underling pathology. Although conventional fat saturation may be adequate for areas of the body with a relative homogeneous $B_0$ field, there are applications in which fat saturation routinely fails. This is particularly true for extremity imaging, off-isocenter imaging, large field of view (FOV) imaging, and challenging areas such as the brachial plexus and skull based, as well as many others. Short-TI inversion recovery (STIR) imaging provides uniform fat suppression, but at a cost of reduced signal-to-noise ratio (SNR) for the water image and mixed contrast that is dependent on $T_1$, (Bydder G M, Pennock J M, Steiner R E, Khenia S, Payne J A, Young I R, The Short T1 Inversion Recovery Sequence—An Approach To MR Imaging Of The Abdomen, Magn. Reson. Imaging 1985; 3(3): 251-254). This latter disadvantage limits STIR imaging to $T_2$ weighted ($T_2$W) applications, such that current $T_1$ weighted ($T_1$W) applications rely solely on conventional fat-saturation methods. Another fat suppression technique is the use of spectral-spatial or water selective pulses; however, this method is also sensitive to field inhomogeneities, (Meyer C H, Pauly J M, Macovski A, Nishimura D G, Simultaneous Spatial And Spectral Selective Excitation, Magn. Reson. Med. 1990; 15(2):287-304).

"In and Out of Phase" Imaging was first described by Dixon in 1984, and is used to exploit the difference in chemical shifts between water and fat in order to separate water and fat into separate images, Dixon W. Simple Proton Spectroscopic Imaging, Radiology 1984; 153:189-194. Glover et al further refined this approach in 1991 with a 3 point method that accounts for magnetic field inhomogeneities created by susceptibility differences, Glover G H, Schneider E, Three-Point Dixon Technique For True Water/Fat Decomposition With B0 Inhomogeneity Correction, Magn. Reson. Med. 1991; 18(2):371-383; Glover G, Multipoint Dixon Technique For Water and Fat Proton and Susceptibility Imaging, Journal of Magnetic Resonance Imaging 1991; 1:521-530. Hardy et al first applied this method with FSE imaging by acquiring three images with the readout centered at the spin-echo for one image and symmetrically before and after the spin-echo in the subsequent two images, Hardy P A, Hinks R S, Tkach J A, Separation Of Fat And Water In Fast Spin-Echo MR Imaging With The Three-Point Dixon Technique, J. Magn. Reson. Imaging 1995; 5(2):181-195.

Recently, Jingfei Ma described an improvement on the original two point technique described by Dixon, Ma J. Breath-Hold Water And Fat Imaging Using A Dual-Echo Two-Point Dixon Technique With an Efficient And Robust Phase-Correction Algorithm, Magn. Reson, Med. 2004; 52(2):415-419. In this method, two echoes that are in-phase and out of phase are acquired, just as in the original description by Dixon, but he uses an upwrapping algorithm to unwrap ambiguities between water and fat, to remove water-fat "swapping" that can occur in the presence of field inhomogeneities. This method has also been extended to a 3D-SPGR acquisition where the two readouts are acquired in the same pulse sequence, or TR, with the readout gradients having opposite polarity, Ma J, Vu A, Son J, Choi H, Hazle J, Fat-Suppressed Three-Dimensional Dual Echo Dixon Technique For contrast Agent Enhanced MRI, J. Magn. Reson. Imag. 2006; 23:36-41.

It has been observed that when multiple images are acquired during a single pulse sequence, or TR, using a readout gradient of alternating polarity, that the images are not spatially aligned with each other as a result of chemical shift artifact. As a result, when the images are combined using one of the above described methods, artifacts such as blurring or double edges occur at the boundaries of tissues and organs even in images that depict only water or fat spin density. This artifact is particularly troublesome at higher $B_0$ field strengths where chemical shift it larger or when the receiver bandwidth is reduced in order to improve the signal to noise ratio (SNR).

SUMMARY OF THE INVENTION

The present invention stems from the discovery of the cause of image artifacts that occur when alternating readout gradients are used to acquire a plurality of images, and includes a correction step that is employed in the image reconstruction process.

An important aspect of the present invention is that the correction step can be more easily performed in k-space. Consider a two point acquisition, with one image in-phase and the second image out of phase. The k-space data set for the first image $s_0(x,y)$ is acquired with the readout from left to right (i.e., positive readout gradient), and the k-space data set for the second image $s_1(x,y)$ is acquired with the readout from right to left (i.e., negative readout gradient). The two reconstructed, real space images can be written, $$s_0(x,y)=(w(x,y)+f(x-\Delta x,y))e^{i\phi_0} \quad (1)$$

and $$s_1(x,y)=(w(x,y)-f(x+\Delta x,y))e^{i(\phi_0+\Delta\phi)} \quad (2)$$

where $w(x,y)$ and $f(x,y)$ are the signals produced by water and fat spins, $\phi_0$ is a constant phase term, resulting from coil sensitivities and other causes. $\Delta\phi$ is the increment in phase due to field inhomogeneities or other time dependent field inhomogeneities. In addition, there may be phase shifts that result from gradient polarity reversals and timing mismatches that are embodied in the phase shift $\Delta\phi$.

$\Delta x$ is the chemical shift. If the scanner center frequency is set to water, the fat in these reconstructed images will be shifted by a small amount in the readout direction when the readout gradient is positive, and by the same amount in the opposite direction when the readout gradient is reversed. The chemical shift (in pixels) between fat signals in the two images is:

$$\Delta x = \frac{N_x \Delta f}{2BW} \quad (3)$$

where BW is readout bandwidth, typically ±20-125 kHz, $N_x$ is the number of k-space samples in the readout matrix and $\Delta f$ is the chemical shift between water and fat, about −210 Hz at 1.5 T. In the discussion below all of the chemical shift is attributed to fat because the system center frequency is tuned to water. The chemical shift can be shifted to water by changing the rf center frequency or it can be set to some value between water and fat.

The phase $\phi_0$ is removed by dividing out the phase of equation (1) from both the signals of equation (1) and (2) such that, $$s'_0(x,y)=(w(x,y)+f(x-\Delta x,y)) \quad (4)$$

and $$s'_1(x,y)=(w(x,y)-f(x+\Delta x,y))e^{i\Delta\phi(x,y)} \quad (5)$$

where $\Delta x$ is the chemical shift measured in pixels.

If the phase map $e^{i\Delta\phi(x,y)}$ is known, it can be demodulated from the second image of equation (5), and $w(x,y)$ and $f(x,y)$ can easily be determined. In general, we do not know $\Delta\phi(x,y)$, although we can remove its effect by taking the magnitude of equation (5). This leads to a natural ambiguity, depending on whether the pixel is water dominant ($w(x,y) > f(x,y)$) or fat dominant ($f(x,y) < w(x,y)$).

A phase unwrapping algorithm such as that described in the above-cited Jingfei Ma reference is used to resolve this ambiguity. A correct solution for the magnitude and sign of each pixel in the image $s'_1(x,y)$ yields:

$$s''_1(x,y)=\pm|w(x,y)-f(x+\Delta x,y)|. \quad (6)$$

If we take the Fourier transformation of the resulting two images of equations (4) and (6), we have the corresponding k-space data sets:

$$S_0=FT\{s'_0(x,y)\}=W(k_x,k_y)+F(k_x,k_y)e^{i\Delta x \Delta X k_x} \quad (7)$$

and $$S_1=FT\{s''_1(x,y)\}=W(k_x,k_y)-F(k_x,k_y)e^{-i\Delta x \Delta X k_x}. \quad (8)$$

From these k-space data sets and noting that $\Delta X=FOV/N_x$ is the pixel dimension (cm), and k-space is sampled from $-k_x^{max}$ to $+k_x^{max}$, with $k_x^{max}=\pi/\Delta X$, we can calculate separate water and fat k-space data sets $W(k_x,k_y)$ and $F(k_x,k_y)$ as, $$W(k_x,k_y) = \frac{S_0 e^{-i\Delta x \Delta X k_x} + S_1 e^{i\Delta x \Delta X k_x}}{e^{-i\Delta x \Delta X k_x} + e^{i\Delta x \Delta X k_x}} \quad (9)$$

$$= \frac{S_0 e^{-i\Delta x \Delta X k_x} + S_1 e^{i\Delta x \Delta X k_x}}{2\cos(\Delta x \Delta X k_x)}$$

and $$F(k_x, k_y) = \frac{S_0 e^{-i\Delta x \Delta X k_x} - S_1 e^{i\Delta x \Delta X k_x}}{2} + \qquad (10)$$
$$W \frac{(e^{-i\Delta x \Delta X k_x} - e^{i\Delta x \Delta X k_x})}{2}$$
$$= \frac{S_0 - S_1}{2\cos(\Delta x \Delta X k_x)}$$

Note that the denominator will never be zero so long as $\Delta x \neq N_x$ and $k_x = \Delta k(n_x + \frac{1}{2})$, $$n = \left[\frac{-N_x}{2}, \frac{N_x - 1}{2}\right].$$

Finally, the water image (w(x,y)) and fat image (f(x,y)) are reconstructed by calculating the inverse Fourier transformation of these k-space data sets of equations (9) and (10). Note that if $\Delta x$ is very small (zero), equations (9) and (10) reduce to the expected solutions, $$W = \frac{S_0 + S_1}{2} \qquad (11)$$

and $$F = \frac{S_0 - S_1}{2}. \qquad (12)$$

A general object of the present invention is to accurately correct for chemical shift errors that occur when images of two different spin species are acquired with readout gradients of opposite polarity.

An object of the invention is to produce water and fat images that are fully corrected for chemical shift errors that are produced when the NMR signals for the two images are acquired with readout gradients of opposite polarity.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DESCRIPTION OF THE PREFERRED EMBODIMENT

Figure 1:
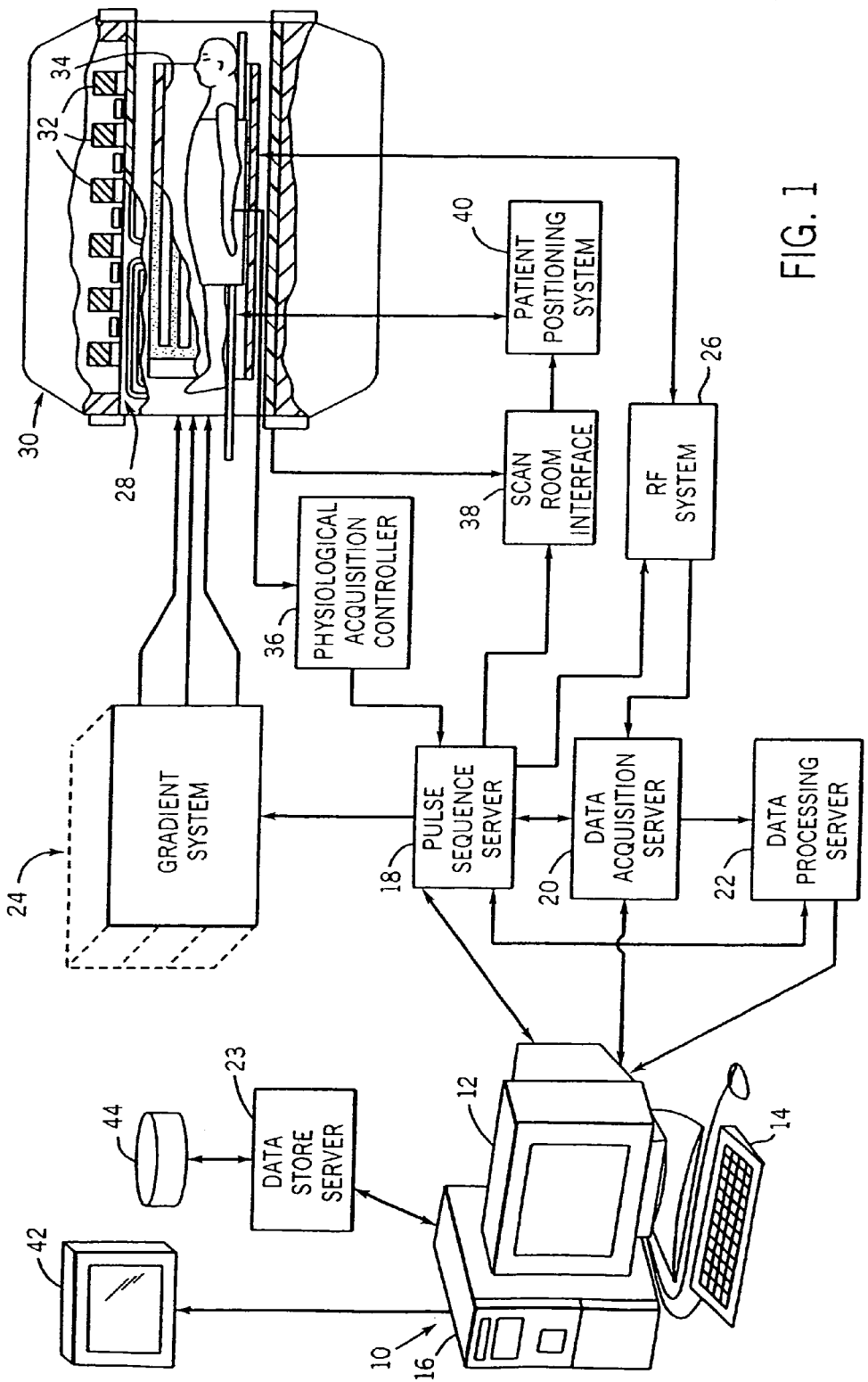
FIG. 1 is a block diagram of an MRI system which employs the present invention.

Referring particularly to FIG. 1, the preferred embodiment of the invention is employed in an MRI system. The MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system.

The workstation 10 is coupled to four servers: a pulse sequence server 18; a data acquisition server 20; a data processing server 22, and a data store server 23. In the preferred embodiment the data store server 23 is performed by the workstation processor 16 and associated disc drive interface circuitry. The remaining three servers 18, 20 and 22 are performed by separate processors mounted in a single enclosure and interconnected using a 64-bit backplane bus. The pulse sequence server 18 employs a commercially available microprocessor and a commercially available quad communication controller. The data acquisition server 20 and data processing server 22 both employ the same commercially available microprocessor and the data processing server 22 further includes one or more array processors based on commercially available parallel vector processors.

The workstation 10 and each processor for the servers 18, 20 and 22 are connected to a serial communications network. This serial network conveys data that is downloaded to the servers 18, 20 and 22 from the workstation 10 and it conveys tag data that is communicated between the servers and between the workstation and the servers. In addition, a high speed data link is provided between the data processing server 22 and the workstation 10 in order to convey image data to the data store server 23.

The pulse sequence server 18 functions in response to program elements downloaded from the workstation 10 to operate a gradient system 24 and an RF system 26. Gradient waveforms necessary to perform the prescribed scan are produced and applied to the gradient system 24 which excites gradient coils in an assembly 28 to produce the magnetic field gradients $G_x$, $G_y$, and $G_z$ used for position encoding NMR signals. The gradient coil assembly 28 forms part of a magnet assembly 30 which includes a polarizing magnet 32 and a whole-body RF coil 34.

RF excitation waveforms are applied to the RF coil 34 by the RF system 26 to perform the prescribed magnetic resonance pulse sequence. Responsive NMR signals detected by the RF coil 34 are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays.

The RF system 26 also includes one or more RF receiver channels. Each RF receiver channel includes an RF amplifier that amplifies the NMR signal received by the coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M=\sqrt{I^2+Q^2},$$

and the phase of the received NMR signal may also be determined:

$$\phi=\tan^{-1}Q/I.$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

It should be apparent that the pulse sequence server 18 performs real-time control of MRI system elements during a scan. As a result, it is necessary that its hardware elements be operated with program instructions that are executed in a timely manner by run-time programs. The description components for a scan prescription are downloaded from the workstation 10 in the form of objects. The pulse sequence server 18 contains programs which receive these objects and converts them to objects that are employed by the run-time programs.

The digitized NMR signal samples produced by the RF system 26 are received by the data acquisition server 20. The data acquisition server 20 operates in response to description components downloaded from the workstation 10 to receive the real-time NMR data and provide buffer storage such that no data is lost by data overrun. In some scans the data acquisition server 20 does little more than pass the acquired NMR data to the data processor server 22. However, in scans which require information derived from acquired NMR data to control the further performance of the scan, the data acquisition server 20 is programmed to produce such information and convey it to the pulse sequence server 18. For example, during prescans NMR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process NMR signals used to detect the arrival of contrast agent in an MRA scan. In all these examples the data acquisition server 20 acquires NMR data and processes it in real-time to produce information which is used to control the scan.

The data processing server 22 receives NMR data from the data acquisition server 20 and processes it in accordance with description components downloaded from the workstation 10. Such processing may include, for example: Fourier transformation of raw k-space NMR data to produce two or three-dimensional images; the application of filters to a reconstructed image; the performance of a backprojection image reconstruction of acquired NMR data; the calculation of functional MR images; the calculation of motion or flow images, etc. As will be described below, the present invention is embodied in software executed by the data processing server 22.

Images reconstructed by the data processing server 22 are conveyed back to the workstation 10 where they are stored. Real-time images are stored in a data base memory cache (not shown) from which they may be output to operator display 12 or a display 42 which is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 2:
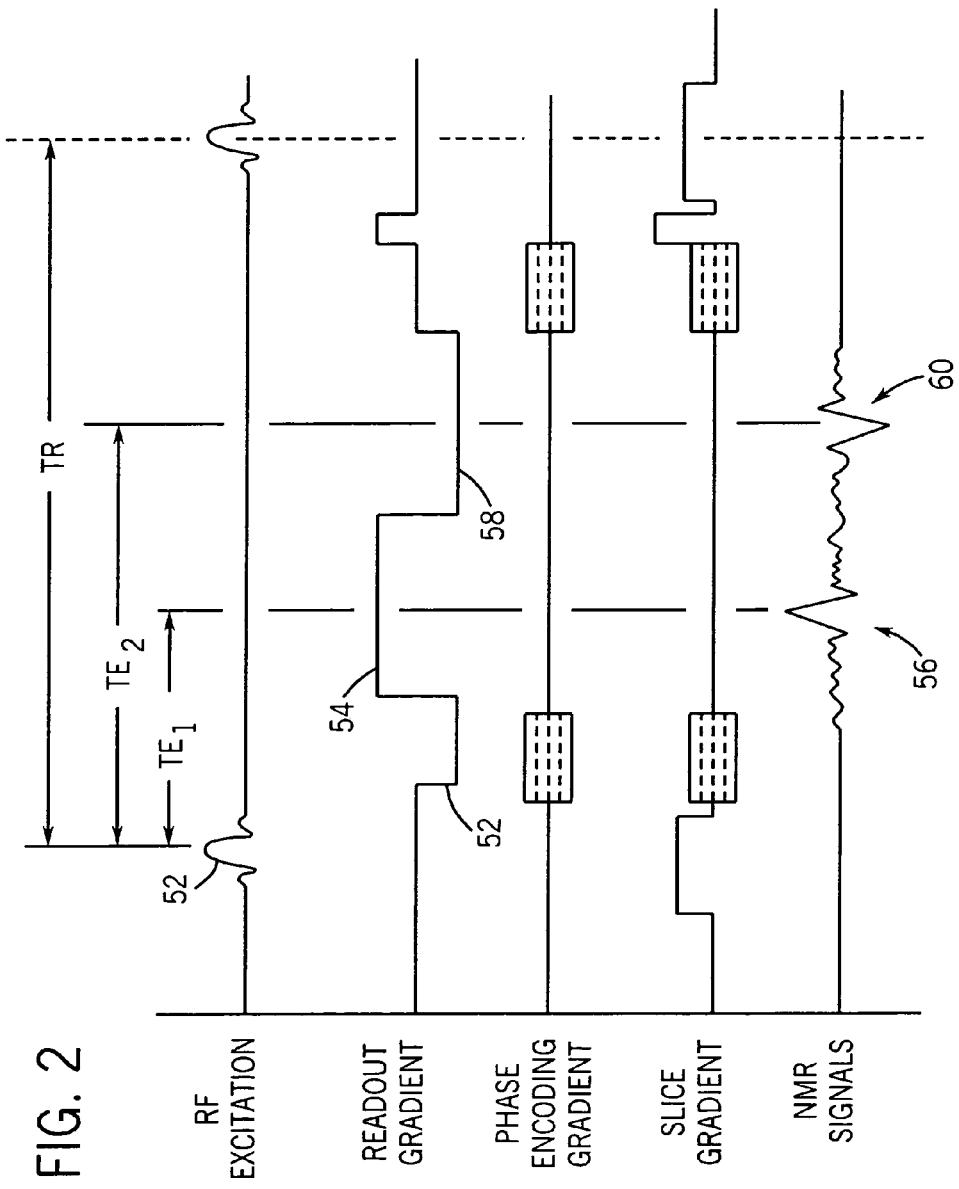
FIG. 2 is a preferred embodiment of a pulse sequence that directs the operation of the MRI system of FIG. 1 to acquire water and fat images.

The MRI system of FIG. 1 can perform many different pulse sequences to produce images and spectroscopic information. The present invention relates to the removal of artifacts that occur when a particular situation is present in the prescribed pulse sequence and subsequent image processing. One such situation is present when the pulse sequence shown in FIG. 2 is prescribed and two images are reconstructed and combined such that either a water or fat image is produced. Many other situations are possible that produce the artifacts that are corrected using the present invention.

Referring particularly to FIG. 2, a pulse sequence that enables separate water and fat images to be acquired is shown. After an rf excitation pulse 50 is generated to tip longitudinal magnetization into the transverse plane a negative dephasing lobe 52 is produced along the readout gradient axis, followed by a positive readout gradient lobe 54, which induces a first gradient-echo NMR signal 56. The timing is selected such that the echo time $TE_1$ of this first NMR signal 56 is set to the point in time when the water and fat signal components in the signal 56 are 180° out of phase. In a 1.5 T system this is 2.3 msec. As is well known in the art the NMR signal 56 samples k-space along a line oriented in the same direction as the readout gradient. Exactly where that sampling trajectory is located in k-space is determined by the phase encoding gradient and slice gradient applied during the pulse sequence as is well known in the art.

The polarity of the readout gradient is then reversed and a second readout gradient lobe 58 is produced to again rephase the transverse magnetization and produce a second gradient-echo NMR signal 60. Because the phase encodings have not changed, the second NMR signal 60 samples along the same, linear k-space sampling trajectory, but it does so in the opposite direction. The echo time $TE_2$ of the second NMR signal 60 is set such that fat and water spins are in phase. At 1.5 T this is 4.6 msec. The pulse sequence of FIG. 2 is repeated with different phase encodings to sample throughout k-space and produce two separate k-space data sets $S_0$ and $S_1$ from which fat/water in-phase and 180° out of phase images can be reconstructed.

If the center frequency of the rf excitation pulse 52 is set to the Larmor frequency of water, the fat signal will be shifted a small amount in the reconstructed image along the readout gradient axis direction due to chemical shift. The amount of this chemical shift ($\Delta x$) measured in image pixels is:

$$\Delta x=N_x\Delta f/2BW,$$

where:

Δf=chemical shift between water and fat which is about −210 Hz at 1.5 T;

$N_x$=number of k-space samples acquired during the readout; and

BW=readout bandwidth which is typically ±20 to 125 kHz.

Importantly, this chemical shift of fat signal occurs in one direction from the water signal when the readout gradient is positive, and the fat signal is shifted by the same amount in the opposite direction from the water signal when the readout gradient is negative. As a result, the fat signal in the two images acquired as described above will not only be chemically shifted Δx from the water signal, but they are chemically shifted 2Δx from each other.

Figure 3:
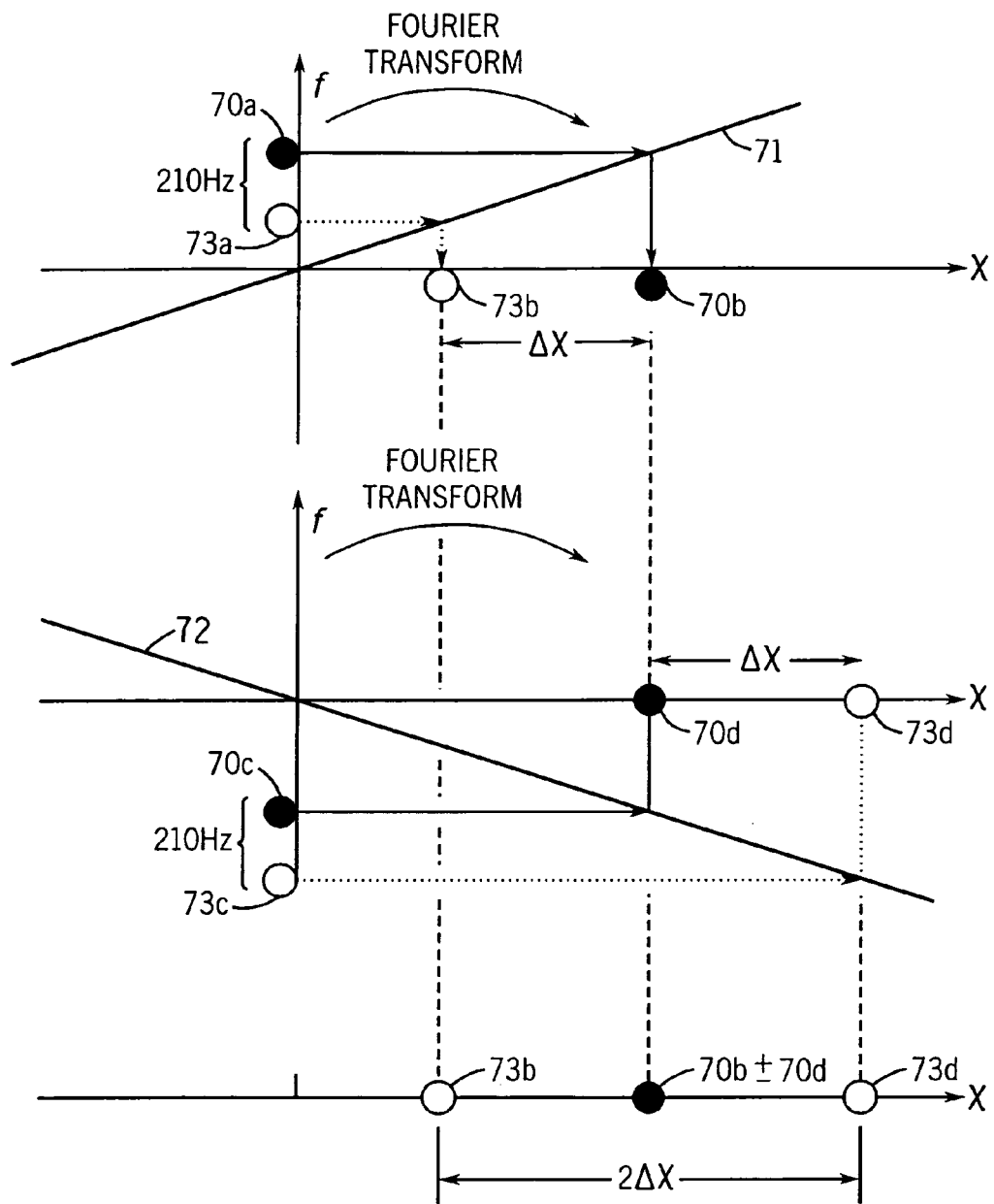
FIG. 3 is a graphic illustration of the misalignment in the signals acquired with the pulse sequence of FIG. 2.

This misalignment of the fat signals in the two reconstructed images is illustrated in FIG. 3. In this example, the center RF excitation is set to the Larmor frequency of water and water spin signal 70a at a particular frequency f is located along the readout axis x at a correct position 70b by the Fourier transformation when in the presence of a positive readout gradient 71. Similarly, the signal 70c produced by the same water spins during the application of a negative readout gradient 72 of the same magnitude will correctly position those spins at location 70d along the readout axis x. The water signals are thus correctly aligned in both images.

The fat signals are off resonance by a small amount (210 Hz at 1.5 T and 520 Hz at 3.0 T) and they are not properly positioned along the readout gradient axis by the Fourier transformation. When the positive gradient 71 is applied, fat spins at the same location produce a slightly lower frequency signal 73a and this Fourier transformation mispositions the fat spins at position 73b which is Δx to one side of the water spins 70b. The same fat spins produce a signal 73c that is positioned Δx to the other side of the water spins 70d at location 73d when the negative readout gradient 72 is produced. As a result, when the two reconstructed images are combined the aligned water spins 70b and 70d correctly indicate spin density at each location along the readout axis x, but the fat signals 73b and 73d are shifted by an amount 2Δx from each other.

Figure 4:
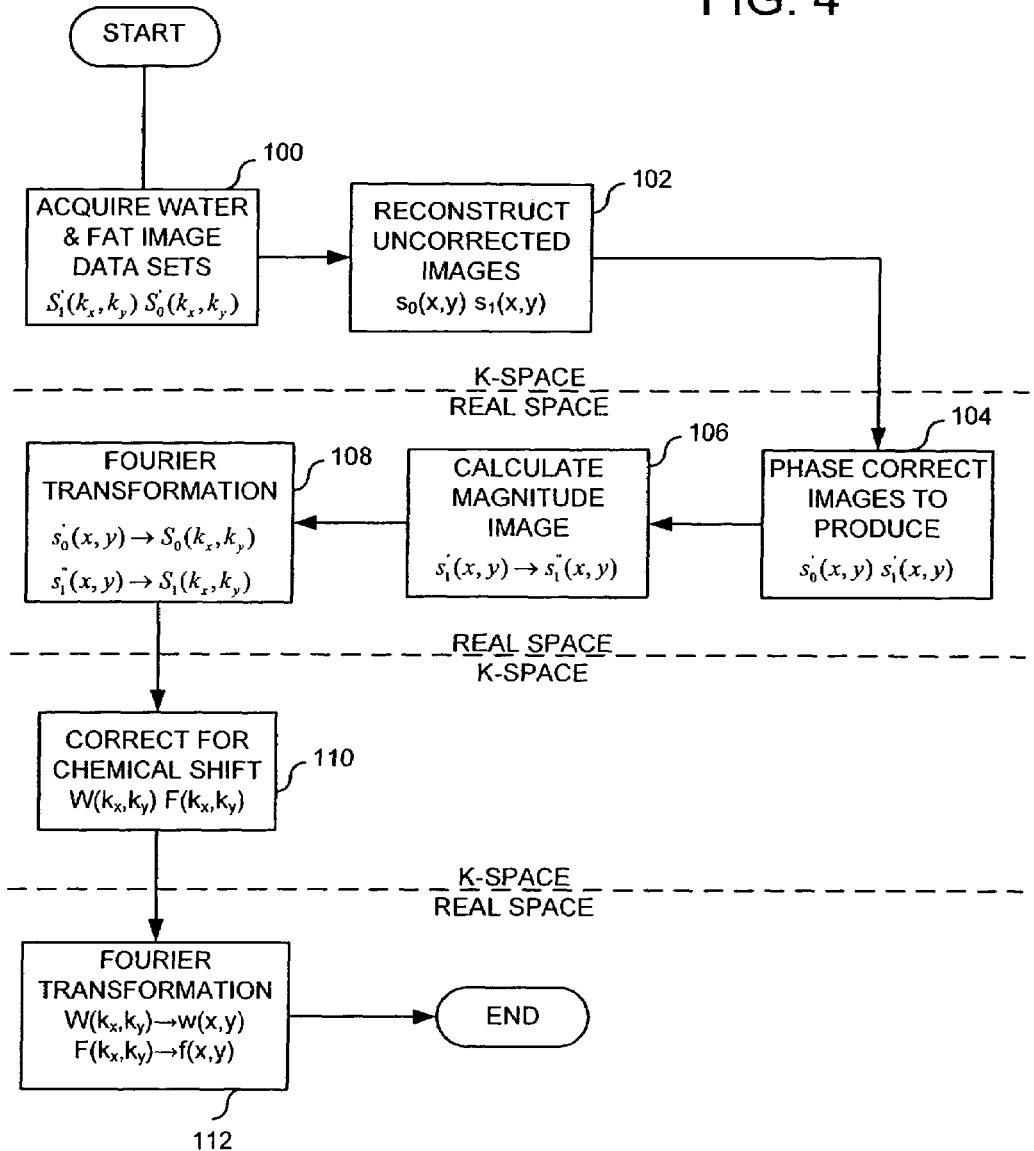
FIG. 4 is a flow chart of the method used to acquire the two images using the pulse sequence of FIG. 2.

Referring particularly to FIG. 4, the present invention is employed in a water/fat imaging procedure in which two images are acquired with the pulse sequence in FIG. 2 as indicated at process block 100. The center frequency of the rf excitation pulse 52 is set to that of water and two k-space data sets $S'_1$ and $S'_0$ are acquired at the prescribed scan parameters.

Two images $s_o$ and $s_i$ are reconstructed from these acquired k-space data sets by performing an inverse Fourier transformation as indicated at process block 102.

Both images are then phase corrected as indicated by process block 104. This is accomplished by dividing the phase at each image pixel in the $s_o(x,y)$ image into itself and into the corresponding pixel of the second image $s_1(x,y)$ to produce the two images $s'_0(x,y)$ and $s'_1(x,y)$ as set forth above in equations (4) and (5). As indicated at process block 106 the magnitude of the phase corrected image $s'_1(x,y)$ is then calculated as described above to produce the image $s''_1(x,y)$ as set forth above in equation (6).

The two corrected images are then transformed back to k-space as indicated at process block 108. This is a Fourier transformation along the readout gradient axis for the purpose of the present invention, although all the axes can be transformed to produce the k-space data sets of equations (7) and (8).

The chemical shift corrections are now made as indicated at process block 110 by calculating the final water k-space data set $W(k_x,k_y)$ according to the above equation (9) and calculating the final fat k-space data set $F(k_x,k_y)$ according to the above equation (10). These two data sets are then Fourier transformed as indicated by process block 112 to produce the final water image w(x,y) and final fat image f(x,y).

Figure 5:
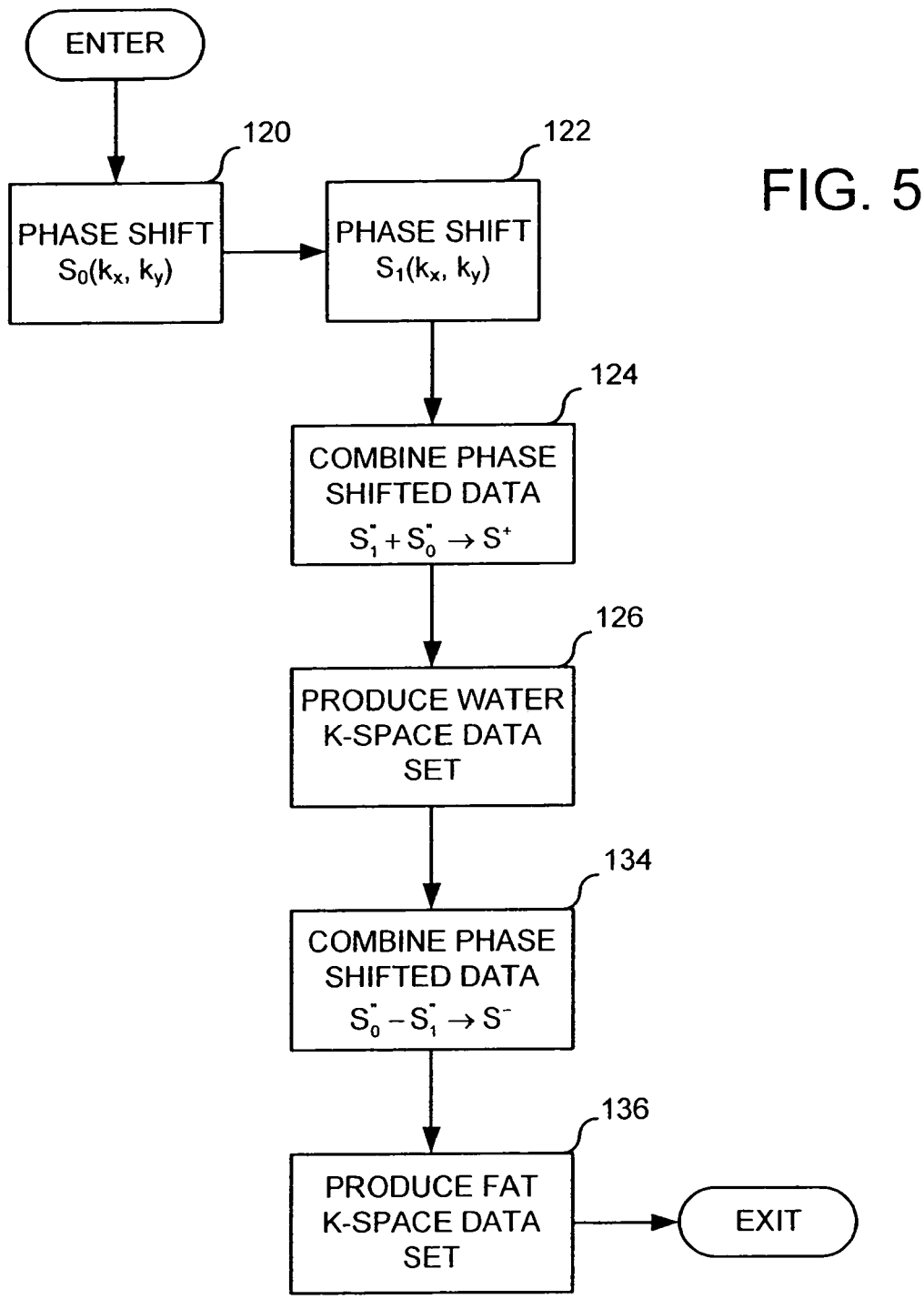
FIG. 5 is a flow chart setting forth the steps of a method in accordance with the present invention.

The calculation of the water image k-space data set according to equation (9) and the fat image k-space data set according to equation (10) is depicted in FIG. 5. As indicated at process blocks 120 and 122, the first steps are to phase shift the k-space data sets $S_0(k_x,k_y)$ and $S_1(k_x,k_y)$. More specifically, the phase shifted data set $S''_0$ is produced by phase shifting each $k_y$ row of k-space data by multiplying by:

$$e^{-i\Delta x \Delta X k_x}.$$

Similarly, the phase shifted data set $s''_1$ is produced by multiplying by:

$$e^{i\Delta x \Delta X k_x}.$$

As indicated by process block 124 the two phase shifted data sets $S''_1$ and $S''_0$ are then added together to produce a k-space data set $S^+(k_x,k_y)$, and the water image k-space data set $W(k_x,k_y)$ is produced at process block 126 by dividing the values therein by $2\cos(\Delta x \Delta X k_x)$.

As indicated at process block 134, the two phase shifted data sets $S''_0$ and $S''_1$ calculated above are then combined by subtracting the values in $S''_1$ from corresponding values in $S''_0$ to form a difference k-space data set $S^-(k_x,k_y)$. As indicated at process block 136, the fat image k-space data set $F(k_x,k_y)$ is then produced by dividing the values therein by $2\cos(\Delta x \Delta X k_x)$.

It should be apparent that unlike prior methods for producing separate images of two chemical species, the combination of the two acquired data sets is performed in k-space rather than image space. This enables the correction of chemical shift artifacts due to the alternating polarity of the readout gradient to be made.

Although water and fat images are produced in the preferred embodiment of the invention, it should be apparent that the present invention is applicable to other clinical applications in which two or more images acquired with readout gradients of opposite polarity are to be combined.

It should be noted that the approach described above can be modified for two additional considerations. First, the details of this correction method were described for the situation where the center frequency of the scanner was set to water. Although this is the typical scenario, the center frequency can be set to other frequencies, including fat, or in between water and fat. In these cases, the phase shifts used to correct for shifting of the fat images acquired with the two gradient polarities can be modified and applied to $s_0$ and $s_1$ appropriately to ensure that water and fat images are correctly aligned. A bulk frequency shift is a simple modification of the above analysis.

Similarly, there can be local off-resonance effects that create an effective local shift in the center frequency. This effect is caused by susceptibility and other off-resonance effects that create a "field inhomogeneity map" across the image. The field map, ψ, is measured in Hz, and creates time dependent phase shifts that can lead to a spatial shift on both water and fat that will be equal and opposite for images acquired with opposite gradient polarities. Most chemical shift imaging methods measure the local field map, ψ, providing an opportunity to correct for the local misalignments of images acquired with opposite gradient polarities due to spatial distortions from the local field inhomogeneities. In situations where the field map is known, its effects may be removed by approaches very similar to those describe above, albeit somewhat more complex in mathematics, but very similar in principle.

The invention claimed is:

1. A method for producing images of a subject containing two spin species with a magnetic resonance imaging (MRI) system, the steps comprising:
    a) acquiring a pair of k-space image data sets using a pulse sequence in which NMR signals ($S'_0$) for one k-space image data set are acquired using a readout gradient of one polarity and NMR signals ($S''_1$) for the other k-space image data set are acquired with a readout gradient of the opposite polarity;
    b) reconstructing two images $s_0$ and $s_1$ from the respective k-space data sets $S'_0$ and $S'_1$;
    c) removing phase shifts from one or both of the two images $s_1$ and $s_0$ to produce respective images $s''_0$ and $s''_1$;
    d) Fourier transforming the two images $s'_0$ and $s''_1$ to k-space;
    e) producing from the resulting k-space data sets $S_0$ and $S_1$ a first spin species k-space data set W and a second spin species k-space data set F that are corrected for chemical shift; and
    f) Fourier transforming the first and second spin species k-space data sets W and F to produce a first spin species image w and a second spin species image f.

2. The method as recited in claim 1 in which the two spin species are hydrogen associated with water and hydrogen associated with fat.

3. The method as recited in claim 1 in which the pulse sequence includes producing an rf excitation pulse tuned to the Larmor frequency of one of said spin species.

4. The method as recited in claim 1 in which step c) includes dividing the phase at each pixel in one of said images $s_1$ or $s_0$ into the corresponding pixel phase of both said one image and the other image.

5. The method as recited in claim 1 in which step e) includes:
    e)i) phase shifting the two k-space data sets $S_0$ and $S_1$;
    e)ii) adding together the two phase shifted data sets produced in step e)i) to produce a summed k-space data set $S^+$;
    e)iii) producing from the summed k-space data set $S^+$ the first spin species k-space data set W;
    e)iv) subtracting the two phase shifted data sets produced in step e)i) to produce a difference k-space data set $S^-$; and
    e)v) producing from the difference k-space data set $S^-$ the second spin species k-space data set F.

* * * * *